United States Patent
Tong et al.

(10) Patent No.: US 11,989,644 B2
(45) Date of Patent: May 21, 2024

(54) THREE-DIMENSIONAL CONVOLUTION OPERATION DEVICE AND METHOD BASED ON THREE-DIMENSIONAL PHASE CHANGE MEMORY

(71) Applicant: HUAZHONG UNIVERSITY OF SCIENCE AND TECHNOLOGY, Hubei (CN)

(72) Inventors: Hao Tong, Hubei (CN); Qing Hu, Hubei (CN); Yuhui He, Hubei (CN); Xiangshui Miao, Hubei (CN)

(73) Assignee: HUAZHONG UNIVERSITY OF SCIENCE AND TECHNOLOGY, Hubei (CN)

( * ) Notice: Subject to any disclaimer, the term of this patent is extended or adjusted under 35 U.S.C. 154(b) by 804 days.

(21) Appl. No.: 17/259,191

(22) PCT Filed: May 28, 2020

(86) PCT No.: PCT/CN2020/092784
§ 371 (c)(1),
(2) Date: Jan. 10, 2021

(87) PCT Pub. No.: WO2021/073104
PCT Pub. Date: Apr. 22, 2021

(65) Prior Publication Data
US 2022/0351026 A1 Nov. 3, 2022

(30) Foreign Application Priority Data
Oct. 18, 2019 (CN) .......................... 201910994255.7

(51) Int. Cl.
*G06N 3/0464* (2023.01)
*G06N 3/063* (2023.01)
(Continued)

(52) U.S. Cl.
CPC .............. *G06N 3/063* (2013.01); *G11C 11/54* (2013.01); *G11C 13/0004* (2013.01);
(Continued)

(58) Field of Classification Search
CPC ............ G06N 3/02; G06N 3/063; G06N 3/04; G06N 3/044; G06N 3/045; G06N 3/0464; G06N 3/065
(Continued)

(56) References Cited

U.S. PATENT DOCUMENTS 11,182,664 B2 * 11/2021 Hsu .......................... G06N 3/048
11,205,116 B2 * 12/2021 Hsu .......................... G06N 3/045

FOREIGN PATENT DOCUMENTS

| CN | 106530210 | 3/2017 |
|---|---|---|
| CN | 107368889 | 11/2017 |
| CN | 109754065 | 5/2019 |

OTHER PUBLICATIONS

"International Search Report (Form PCT/ISA/210) of PCT/CN2020/092784," mailed on Aug. 27, 2020, pp. 1-5.

* cited by examiner

*Primary Examiner* — Kent Yip
(74) *Attorney, Agent, or Firm* — JCIP GLOBAL INC.

(57) ABSTRACT

The disclosure discloses a three-dimensional (3D) convolution operation device and method based on a 3D phase change memory, which includes a 3D phase change memory, an input control module, a setting module, and an output control module. By using the 3D phase change memory to perform 3D convolution operation, the phase change units on the same bit line constitute a convolution kernel. Based on the multilayer stack structure, the upper and lower electrodes of the 3D phase change memory serve as the information input terminal, and they are convolved after passing through the respective phase change unit
(Continued)

arrays, and the result of the convolution operation is superposed on the middle electrode in the form of current, thereby obtaining the sum of the convolution calculation results of the input information of the upper and lower electrodes, such that the 3D convolution operation is completed in one step.

8 Claims, 3 Drawing Sheets

(51) Int. Cl.
     *G11C 11/54*        (2006.01)
     *G11C 13/00*        (2006.01)

(52) U.S. Cl.
     CPC ........ *G11C 13/003* (2013.01); *G11C 2213/71* (2013.01); *G11C 2213/77* (2013.01)

(58) Field of Classification Search
     USPC ........................................................ 382/279
     See application file for complete search history.

THREE-DIMENSIONAL CONVOLUTION OPERATION DEVICE AND METHOD BASED ON THREE-DIMENSIONAL PHASE CHANGE MEMORY

CROSS-REFERENCE TO RELATED APPLICATION

This application is a 371 of international application of PCT application serial no. PCT/CN2020/092784, filed on May 28, 2020, which claims the priority benefit of China application no. 201910994255.7, filed on Oct. 18, 2019. The entirety of each of the above mentioned patent applications is hereby incorporated by reference herein and made a part of this specification.

BACKGROUND

Field of the Disclosure

The disclosure belongs to the field of microelectronic devices, and more specifically, relates to a three-dimensional (3D) convolution operation device and method based on a three-dimensional phase change memory.

Description of Related Art

Convolutional Neural Network (CNN) is a feedforward neural network that includes convolution operations. CNN includes a convolutional layer, a pooling layer, and a fully connected layer. The data is input from the convolutional layer. In the convolutional layer, a convolution operation on the input data is performed through the convolution kernel to extract the feature value, and then the number of data and parameters are compressed through the pooling layer. After performing several times of convolution and pooling, the data passes through the fully connected layer used as a classifier. Convolutional neural network has unique advantages in pattern recognition with its special structure of local weight sharing. Weight sharing reduces the complexity of the network, and has a wide range of applications in machine learning, language recognition and image recognition.

Three-dimensional convolutional neural network adds the dimension of time on the basis of ordinary convolutional neural network. By calculating input information of adjacent timing, the network can extract a certain correlation between different timings, so it is possible to further perform video processing other than image processing.

However, the convolutional neural network requires a large number of matrix operations to be performed, that is, the convolution process, which is not the typical operation that the central processing unit (CPU) of the computer can perform well, and therefore it takes a long training time. Meanwhile, optimization and acceleration based on the algorithm itself cannot solve the fundamental problem. Since the memory array has a cross structure, which inherently can realize convolution operation rapidly, and is commonly adopted in the convolutional neural network to realize the convolution operation therein, good results have been achieved.

The existing three-dimensional convolution operation method is implemented by using multiple memory arrays with a planar structure. When such method is adopted in performing three-dimensional convolution operations, when dealing with problems such as video processing, the convolution operation needs to be performed on each frame of image in its own storage array, and then the results of the convolution operations of two adjacent frames of image are added up through an integration module to obtain the three-dimensional convolution operation result. This fractional step computing method makes the operation speed slower, and the operation power consumption is large. In addition, when processing each frame of image, a storage array with a planar structure is required for convolution operation. Therefore, a large number of storage arrays are required, and a large area will be occupied, which causes certain problems for high-density integration.

In summary, it is an urgent issue to provide a three-dimensional convolution operation device and method with a faster operation speed.

SUMMARY OF THE DISCLOSURE

In view of the shortcomings of the related art, the purpose of the disclosure is to provide a three-dimensional convolution operation device and method based on a three-dimensional phase change memory, which aims to solve the problem of a slower computing speed in the related art caused by the reason that when performing the 3D convolution operation the convolution operations is need to be performed on the two adjacent input data separately, and thereafter an integration module is adopted to add up and perform the fractional step computing.

In order to achieve the above purpose, an aspect of the disclosure provides a three-dimensional convolution operation device based on a three-dimensional phase change memory, which includes a three-dimensional phase change memory, an input control module, a setting module, and an output control module.

Specifically, the three-dimensional phase change memory includes an upper electrode, a lower electrode, a phase change unit, and a middle electrode. The input control module is connected to the upper electrode and the lower electrode respectively, the setting module is connected to the phase change unit, and the output control module is connected to the middle electrode.

The three-dimensional phase change memory is configured to simultaneously realize the convolution operation process of the input information of the upper and lower electrodes and the respective convolution kernels as well as the addition process of the convolution operation results based on its multilayer stack structure, thereby completing the three-dimensional convolution operation in one step and achieving a faster computing speed.

The input control module is configured to divide the two adjacent groups of input information into information blocks with the same number of columns as the three-dimensional phase change memory, and convert the information blocks into corresponding voltage amplitudes, and then simultaneously and sequentially input each group of the information block into the upper electrode and lower electrode of the three-dimensional phase change memory.

The setting module is configured to adjust the conductance value of each phase change unit based on the value of the convolution kernel.

The output control module is configured to detect the current output by the middle electrode in the three-dimensional phase change memory and convert the current into voltage information, which is the result of the three-dimensional convolution operation.

Further preferably, the phase change units on the same bit line in the three-dimensional phase change memory constitute a convolution kernel, in which the number of bit lines is greater than or equal to the number of convolution kernels, and the number of word lines is greater than or equal to the size of the convolution kernel.

Another aspect of the disclosure provides a three-dimensional convolution operation method based on a three-dimensional phase change memory, which includes the following steps.

S1: The corresponding bit line is selected in the three-dimensional phase change memory, and the conductance value of the phase change unit on each bit line is adjusted according to the value of the convolution kernel.

S2: A sliding window is adopted to slide on two adjacent groups of input information according to a preset step length, and the two groups of input information are divided into multiple information blocks with the same size as the convolution kernel.

S3: Two adjacent groups of the information blocks are converted into corresponding voltage amplitudes, and the two groups of the information blocks are respectively input into the upper electrode and the lower electrode of the three-dimensional phase change memory simultaneously and sequentially to complete the convolution operation.

S4: Every time the information block is input, the current output by the middle electrode at the selected bit line of the three-dimensional phase change memory is detected respectively, and the current is converted into voltage information and recorded to obtain the output vector, which is the result of the three-dimensional convolution operation.

Further preferably, the number of bit lines selected in the three-dimensional phase change memory is the same as the number of convolution kernels.

Further preferably, the size of the sliding window is equal to the size of the convolution kernel.

Further preferably, the voltage amplitude corresponding to the maximum value in the input information is less than the set voltage of the phase change unit, so as to ensure that the conductance value of the phase change unit does not change during the convolution operation.

Compared with the related art, the technical solutions conceived by the disclosure can achieve the following advantageous effects.

1. The disclosure provides a three-dimensional convolution operation method based on a three-dimensional phase change memory. The phase change units on the same bit line of the three-dimensional phase change memory constitute a phase change unit array, corresponding to a convolution kernel. The three-dimensional phase change memory has a multilayer stack structure. The upper and lower electrodes of the three-dimensional phase change memory are configured as information input terminals, and they are convolved after passing through the respective phase change unit arrays, and the result of the convolution operation is superposed on the middle electrode in the form of current. When the upper and lower electrodes of the three-dimensional phase change memory input information, the sum of the convolution calculation results of the input information of the upper and lower electrodes can be obtained on the middle electrode at the same time. The three-dimensional convolution operation is completed in one step, the computing speed is faster, and the operation power consumption is also small.

2. The disclosure provides a three-dimensional convolution operation device based on a three-dimensional phase change memory. The three-dimensional convolution operation device adopts a three-dimensional phase change memory to perform three-dimensional convolution operations. The three-dimensional phase change memory includes a memory array with a three-dimensional structure, which can simultaneously perform convolution operation on two or more input information, occupies less area and has a higher level of integration. Therefore, the three-dimensional convolution operation can be performed at a faster computing speed with a smaller occupied area.

3. A three-dimensional convolution operation device and method based on a three-dimensional phase change memory provided by the disclosure has the integration of storage and computation and a faster computing speed compared with the conventional software-based method.

DESCRIPTION OF EMBODIMENTS

In order to make the objectives, technical solutions and advantages of the present disclosure clearer, the following further describes the present disclosure in detail with reference to the accompanying drawings and embodiments. It should be understood that the specific embodiments described here are only used to explain the present disclosure, but not to limit the present disclosure.

Figure 1:
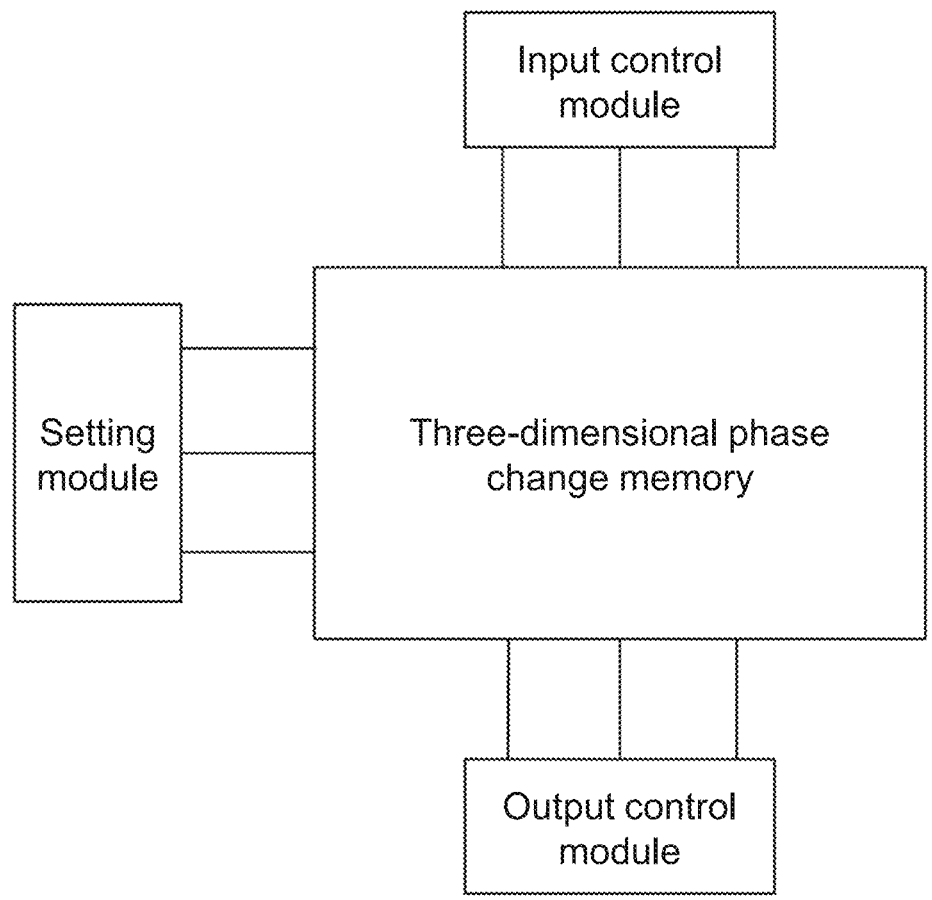
FIG. 1 is a schematic diagram of a three-dimensional convolution operation device based on a three-dimensional phase change memory provided by the disclosure.

In order to achieve the above purpose, an aspect of the disclosure provides a three-dimensional convolution operation device based on a three-dimensional phase change memory, as shown in FIG. 1, the three-dimensional convolution operation device includes a three-dimensional phase change memory, an input control module, a setting module, and an output control module.

Figure 2:
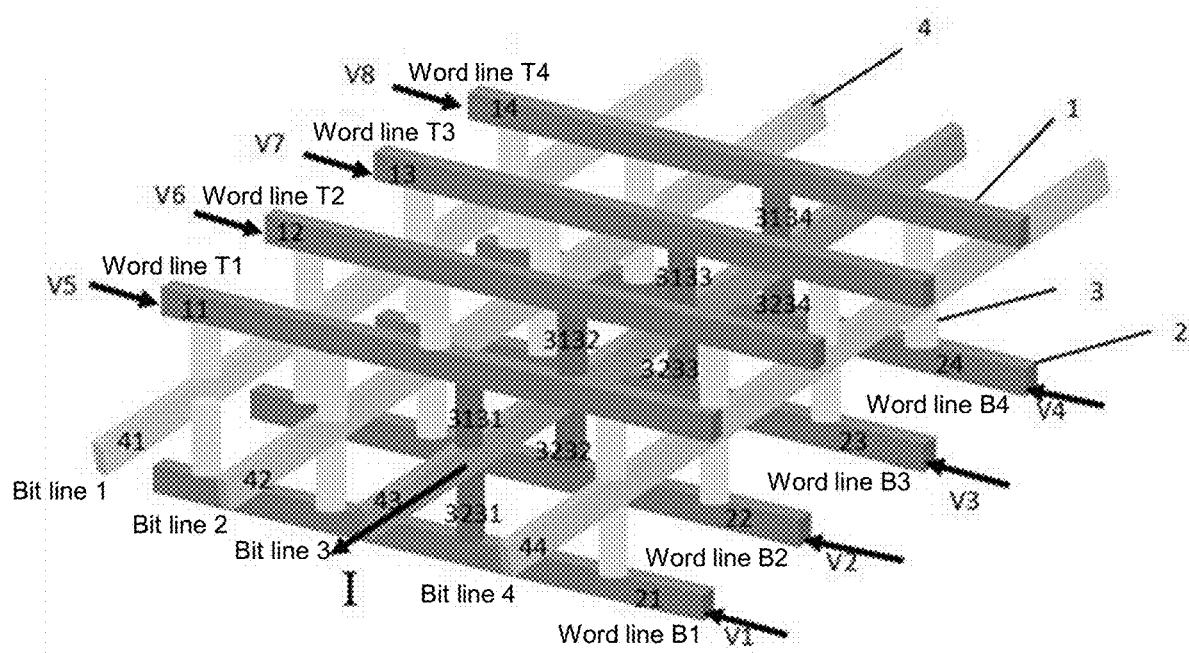
FIG. 2 is a schematic diagram of the structure of the three-dimensional phase change memory provided by the disclosure.

Specifically, the three-dimensional phase change memory has a multilayer array structure, as shown in FIG. 2, including an upper layer 1, a lower layer 2, a phase change unit array 3, and a middle layer 4. The upper layer 1 includes upper electrodes 11 to 14, and the lower layer 2 includes lower electrodes 21 to 24. The phase change unit array 3 includes the upper phase change units 3131 to 3134 and the lower phase change units 3231 to 3234, which together form a three-dimensional phase change unit array. The middle layer 4 includes the middle electrodes 41 to 44. The input control module is connected with the upper electrodes 11 to 14 in the upper layer and the lower electrodes 21 to 24 in the lower layer respectively. The setting module is connected to the phase change unit array 3 of each layer on the three-dimensional phase change memory. The output control module is connected to the middle electrodes 41 to 44 in the middle layer.

The three-dimensional phase change memory is configured to simultaneously realize the convolution operation process of the input information of the upper and lower electrodes and the respective convolution kernels as well as the addition process of the convolution operation results based on its multilayer stack structure, thereby completing the three-dimensional convolution operation in one step and achieving a faster computing speed. The phase change units on the same bit line in the three-dimensional phase change memory constitute a convolution kernel, in which the number of bit lines is greater than or equal to the number of convolution kernels, and the number of word lines is greater than or equal to the size of the convolution kernel.

The input control module is configured to divide the two adjacent groups of input information into information blocks with the same number of columns as the three-dimensional phase change memory, and convert the information blocks into corresponding voltage amplitudes, and then simultaneously and sequentially input each group of the information block into the upper electrode and lower electrode of the three-dimensional phase change memory.

The setting module is configured to adjust the conductance value of each phase change unit based on the value of the convolution kernel.

The output control module is configured to detect the current output by the middle electrode in the three-dimensional phase change memory and convert the current into voltage information, which is the result of the three-dimensional convolution operation.

Another aspect of the disclosure provides a three-dimensional convolution operation method based on a three-dimensional phase change memory, which includes the following steps.

S1: The corresponding bit line is selected in the three-dimensional phase change memory, and the conductance value of the phase change unit on each bit line is adjusted according to the value of the convolution kernel. Specifically, the number of bit lines selected in the three-dimensional phase change memory is the same as the number of convolution kernels.

Specifically, the value of the convolution kernel is compared with the conductance value of the phase change unit on the current bit line to see if they are equal to each other. If not, a voltage pulse is applied at both ends of the phase change unit to adjust the conductance value according to the resistive conversion characteristics of the phase change unit, such that the conductance value is equal to the value of the convolution kernel.

S2: A sliding window is adopted to slide on two adjacent groups of input information according to a preset step length, and the two groups of input information are divided into multiple information blocks with the same size as the convolution kernel. Specifically, the size of the sliding window is equal to the size of the convolution kernel. Specifically, the voltage amplitude corresponding to the maximum value in the input information is less than the set voltage of the phase change unit.

S3: Two adjacent groups of the information blocks are converted into corresponding voltage amplitudes, and the two groups of the information blocks are respectively input into the upper electrode and the lower electrode of the three-dimensional phase change memory simultaneously and sequentially to complete the convolution operation.

S4: Every time the information block is input, the current output by the middle electrode at the selected bit line of the three-dimensional phase change memory is detected respectively, and the current is converted into voltage information and recorded to obtain the output vector, which is the result of the three-dimensional convolution operation.

Figure 3:
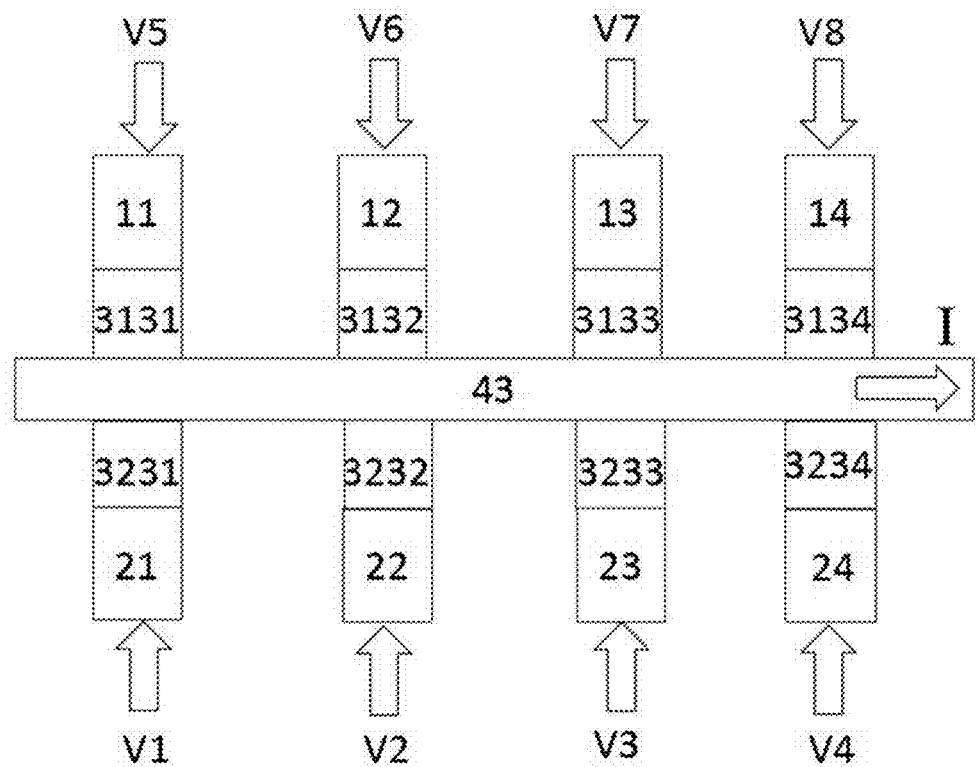
FIG. 3 is a schematic cross-sectional diagram of the three-dimensional phase change memory provided by the disclosure.

Specifically, FIG. 3 is a schematic cross-sectional diagram of the three-dimensional phase change memory. Taking the output of the middle electrode where the bit line 3 is located in the three-dimensional phase change memory as an example. Under the circumstances, the voltage amplitudes corresponding to two adjacent groups of the information blocks of are {V1, V2, V3, V4} and {V5, V6, V7, V8} respectively, which are input from the lower electrodes 21 to 24 and upper electrodes 11 to 14 of the three-dimensional phase change memory respectively. The convolution operation is performed respectively on the lower phase change unit array and the upper phase change unit array where the bit line 3 is located, and the result flows out in the form of current I through the middle electrode 43. The phase change units 3131 to 3134 in the upper phase change array form a convolution kernel, which is subjected to the convolution operation along with the information block input by the upper layer; the phase change units 3231 to 3234 in the lower phase change array form a convolution kernel, which is subjected to the convolution operation along with the information block input by the lower layer. Here the conductance value of each phase change unit is adjusted according to the value of the convolution kernel, and the voltage corresponding to the information block is applied at both ends of each phase change unit. The resulting current I is the product of voltage and conductance. The outflowing current of each phase change unit in the upper and lower layers is superposed at the middle electrode 43 to obtain the three-dimensional convolution operation result.

Figure 4:
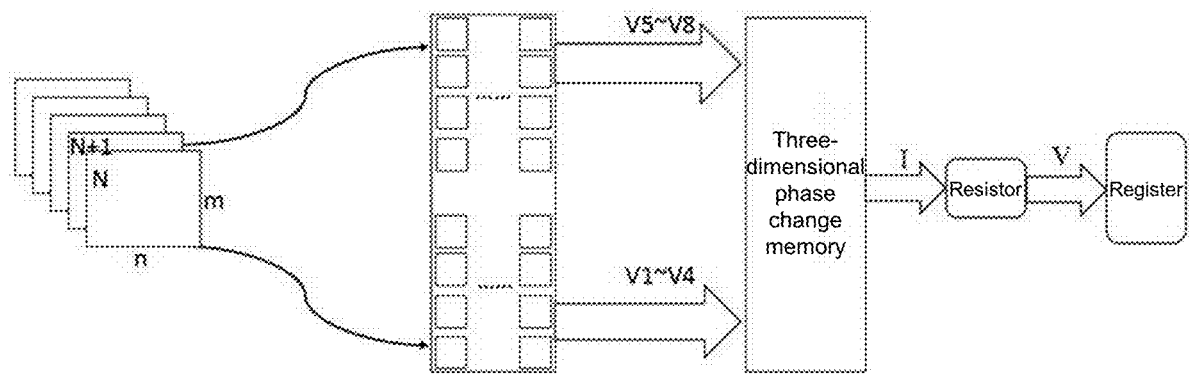
FIG. 4 is a schematic flowchart of a three-dimensional convolution operation method based on a three-dimensional phase change memory provided by the disclosure.

In order to further describe the three-dimensional convolution operation method based on the three-dimensional phase change memory provided by the disclosure, taking input video information as an example. The disclosure provides a three-dimensional convolution operation method based on three-dimensional phase change memory, as shown in FIG. 4, wherein m and n respectively represent the row and column of each frame of image, and N represents the number of frames of the image. The three-dimensional convolution operation method specifically includes the following steps.

S1: The corresponding bit line is selected in the three-dimensional phase change memory, and the conductance value of the phase change unit on each bit line is adjusted according to the value of the convolution kernel.

S2: A sliding window is adopted to slide on two consecutive frames of images N and N+1 in the video information according to a preset step length, and the two groups of input images are divided into multiple information blocks with the same size as the convolution kernel. Specifically, the size of the sliding window is equal to the size of the convolution kernel.

Figure 5:
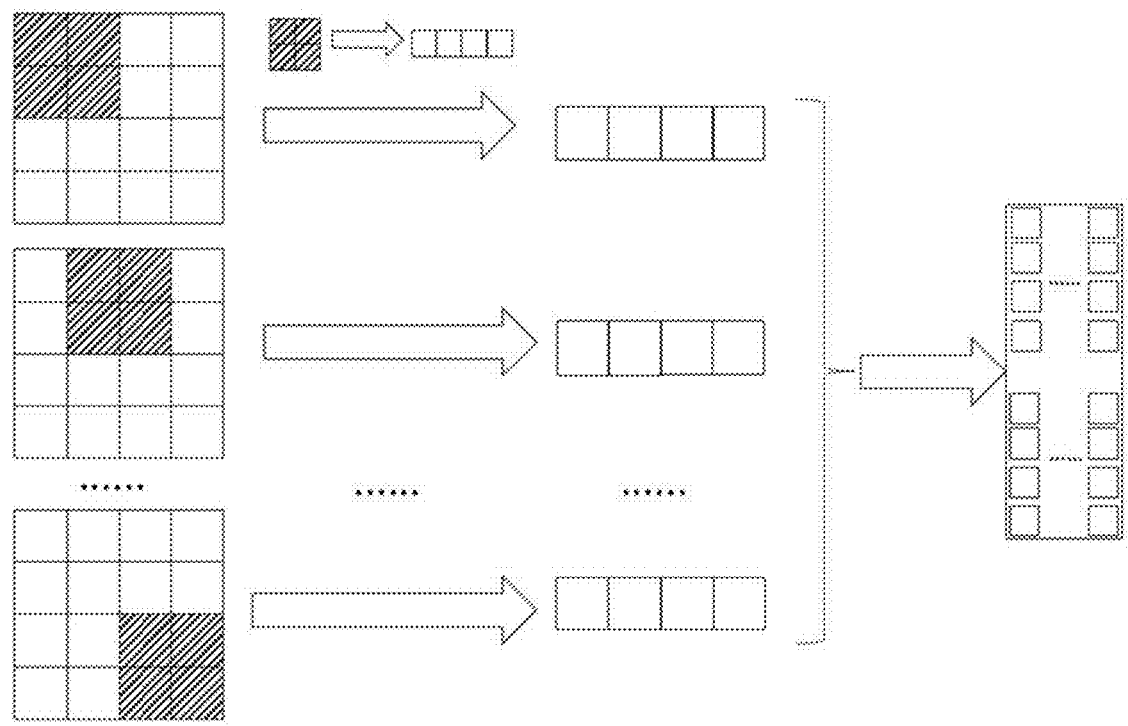
FIG. 5 is a schematic diagram of dividing an input image by using a sliding window provided by an embodiment of the disclosure.

Specifically, in this embodiment, the size of the convolution kernel is 2×2, and a sliding window of size 2×2 is adopted to slide on two consecutive frames of images N and N+1 in the video information according to the preset step length, as shown in FIG. 5. Every time the sliding window slides on the image, a vector with size 1×4 is obtained, and the obtained vector is transposed to obtain a group of column vectors arranged in order. The preset step length is set to 1 in this embodiment.

S3: The two adjacent groups of the information blocks are converted into corresponding voltage amplitudes, and the two groups of the information blocks are respectively input into the upper electrode and the lower electrode of the three-dimensional phase change memory simultaneously and sequentially to complete the convolution operation.

Specifically, pixels 0 to 255 are equally divided into 8 parts, which are pixel intervals 0~31, 32~63, 64~95, 96~127, 128~459, 160~491, 192~223, 224~255, corresponding to voltages 0, 0.125V, 0.25V, 0.375V, 0.5V, 0.625V, 0.75V, and 0.875V. In order to ensure that the resistance value of the phase change unit does not change during the voltage application process of the phase change unit, the voltage amplitude corresponding to the maximum value in the information block needs to be less than the set voltage of the phase change unit, and therefore the above voltage values are adjusted according to proportions. The maximum value is set to a voltage $V_{set}$ less than the set voltage of the phase change unit, then the corresponding voltage amplitude of the pixel interval is $$\frac{V_{cur}}{V_{max}} \times V_{set},$$

wherein $V_{cur}$ is the voltage amplitude corresponding to the current pixel interval and is one of 0, 0.125V, 0.25V, 0.375V, 0.5V, 0.625V, 0.75V, and 0.875V. $V_{max}$ is the maximum value of the voltage amplitude corresponding to the current pixel interval, that is, 0.875V. In this embodiment, the phase change unit is GST ($Ge_2Sb_2Te_5$), and the set voltage thereof is 1.2V. In this embodiment, the value of $V_{set}$ is 1V.

S4: Every time an information block is input, the current output by the middle electrode at the selected bit line of the three-dimensional phase change memory is detected respectively, and the current is converted into voltage information and stored in a register, which is the result of the three-dimensional convolution operation.

The disclosure provides a three-dimensional convolution operation device and method based on a three-dimensional phase change memory, which adopts a three-dimensional phase change memory to perform three-dimensional convolution operations. The phase change units on the same bit line of the three-dimensional phase change memory constitute a phase change unit array, which corresponds to a convolution kernel. The three-dimensional phase change memory has a multilayer stack structure. The upper and lower electrodes of the three-dimensional phase change memory serve as information input terminals, and they are convolved after simultaneously passing through the respective phase change unit arrays. The obtained result of the convolution operation is superposed on the middle electrode in the form of current. When the upper and lower electrodes of the three-dimensional phase change memory input information, the sum of the convolution operation results of input information of the upper and lower electrodes can be obtained on the middle electrode simultaneously. The three-dimensional convolution operation is completed in one step, and the computing speed is faster with smaller operation power consumption. Meanwhile, the memory array based on the three-dimensional structure of the three-dimensional phase change memory performs three-dimensional convolution operation, which occupies a smaller area and has higher integration. As compared with the existing technology, the disclosure improves three-dimensional convolution operation speed with a smaller occupied area.

Those skilled in the art can easily understand that the above descriptions are only preferred embodiments of the present disclosure and are not intended to limit the present disclosure. Any modification, equivalent replacement and improvement, etc. made within the spirit and principle of the present disclosure should fall within the protection scope of the present disclosure.

What is claimed is:

1. A three-dimensional convolution operation device based on a three-dimensional phase change memory, characterized in comprising the three-dimensional phase change memory, an input control module, a setting module, and an output control module;

the three-dimensional phase change memory comprises an upper electrode, a lower electrode, a phase change unit, and a middle electrode, the input control module is connected to the upper electrode and the lower electrode respectively, the setting module is connected to the phase change unit, and the output control module is connected to the middle electrode;

the three-dimensional phase change memory is configured to simultaneously realize a convolution operation process of input information of the upper electrode and the lower electrode and respective convolution kernels as well as an addition process of convolution operation results based on its multilayer stack structure, thereby completing a three-dimensional convolution operation in one step;

the input control module is configured to divide two adjacent groups of input information into information blocks with the same number of columns as the three-dimensional phase change memory, and convert the information blocks into corresponding voltage amplitudes, and then simultaneously and sequentially input each group of the information block into the upper electrode and the lower electrode of the three-dimensional phase change memory;

the setting module is configured to adjust a conductance value of each phase change unit based on a value of the convolution kernel;

the output control module is configured to detect a current output by the middle electrode in the three-dimensional phase change memory and convert the current into voltage information, which is a result of the three-dimensional convolution operation.

2. The three-dimensional convolution operation device based on the three-dimensional phase change memory according to claim 1, wherein the phase change units on a same bit line in the three-dimensional phase change memory constitute one of the convolution kernels, in which the number of the bit lines is greater than or equal to the number of the convolution kernels, and the number of word lines is greater than or equal to the size of the convolution kernels.

3. The three-dimensional convolution operation device based on the three-dimensional phase change memory according to claim 2, wherein the three-dimensional convolution operation device is applied to the field of microelectronic device.

4. The three-dimensional convolution operation device based on the three-dimensional phase change memory according to claim 1, wherein the three-dimensional convolution operation device is applied to the field of microelectronic device.

5. A three-dimensional convolution operation method based on a three-dimensional phase change memory, characterized in comprising the following steps:

S1: selecting a corresponding bit line in the three-dimensional phase change memory, and adjusting a conductance value of a phase change unit on each of the bit lines according to a value of a convolution kernel;

S2: adopting a sliding window to slide on two adjacent groups of input information according to a preset step length, and dividing the two groups of input information into multiple information blocks with the same size as the convolution kernel;

S3: converting two adjacent groups of the information blocks into corresponding voltage amplitudes, and inputting the two adjacent groups of the information blocks into an upper electrode and a lower electrode of the three-dimensional phase change memory simultaneously and sequentially to complete a convolution operation;

S4: every time the information block is input, detecting a current output by a middle electrode at the selected bit line of the three-dimensional phase change memory respectively, and converting the current into voltage information and recording to obtain an output vector, which is a result of the three-dimensional convolution operation.

6. The three-dimensional convolution operation method based on the three-dimensional phase change memory according to claim 5, wherein the number of the bit lines selected in the three-dimensional phase change memory is the same as the number of the convolution kernels.

7. The three-dimensional convolution operation method based on the three-dimensional phase change memory according to claim 5, wherein the size of the sliding window is equal to the size of the convolution kernel.

8. The three-dimensional convolution operation method based on the three-dimensional phase change memory according to claim 5, wherein a voltage amplitude corresponding to a maximum value in the input information is less than a set voltage of the phase change unit.

* * * * *